(12) United States Patent
Liang

(10) Patent No.: US 9,219,478 B2
(45) Date of Patent: Dec. 22, 2015

(54) CIRCUIT SWITCH FOR KEYBOARD

(71) Applicant: Hui-Hu Liang, Sioushuei Township, Changhua County (TW)

(72) Inventor: Hui-Hu Liang, Sioushuei Township, Changhua County (TW)

( * ) Notice: Subject to any disclaimer, the term of this patent is extended or adjusted under 35 U.S.C. 154(b) by 241 days.

(21) Appl. No.: 13/895,003

(22) Filed: May 15, 2013

(65) Prior Publication Data
US 2014/0339066 A1 Nov. 20, 2014

(51) Int. Cl.
*H03K 17/975* (2006.01)

(52) U.S. Cl.
CPC ..................... *H03K 17/975* (2013.01)

(58) Field of Classification Search
CPC .............. H03K 17/957; H03K 17/962; H01H 2239/006; H01H 2215/006; H01H 1/029; H01H 17/9622; H01H 25/04
USPC ......................................................... 200/600
See application file for complete search history.

(56) References Cited

U.S. PATENT DOCUMENTS

| | | | |
|---|---|---|---|
| 3,921,167 A | 11/1975 | Fox | |
| 4,736,076 A * | 4/1988 | Mochizuki et al. | 200/600 |
| 4,876,461 A * | 10/1989 | Gratke | 307/116 |
| 8,735,755 B2 * | 5/2014 | Peterson et al. | 200/600 |
| 8,927,890 B2 * | 1/2015 | Peterson et al. | 200/600 |
| 8,946,579 B2 * | 2/2015 | Ryonai et al. | 200/600 |
| 2008/0180872 A1 * | 7/2008 | Mishima et al. | 361/139 |
| 2011/0308929 A1 * | 12/2011 | Kim et al. | 200/600 |
| 2012/0222948 A1 * | 9/2012 | Lin et al. | 200/600 |
| 2012/0228109 A1 * | 9/2012 | Wang et al. | 200/600 |
| 2013/0126325 A1 * | 5/2013 | Curtis et al. | 200/5 A |
| 2013/0213788 A1 * | 8/2013 | Tanabe et al. | 200/600 |
| 2013/0299331 A1 * | 11/2013 | Mittleman et al. | 200/600 |
| 2014/0224633 A1 * | 8/2014 | Peterson et al. | 200/5 A |

FOREIGN PATENT DOCUMENTS

| | | | |
|---|---|---|---|
| CN | 201781473 U | 3/2011 | |
| EP | 225748 A2 * | 6/1987 | ............ H01H 13/70 |
| TW | M377824 | 4/2010 | |

* cited by examiner

*Primary Examiner* — Kyung Lee
(74) *Attorney, Agent, or Firm* — Muncy, Geissler, Olds & Lowe, P.C.

(57) ABSTRACT

A circuit switch for a keyboard is formed of a first plate and a second plate. A first sensitive portion and a second sensitive portion are mounted on a surface of the first plate, superposed on each other, and electrically insulated against each other. A first conductive wire is located on the first plate and electrically connected with the first sensitive portion. A conductive portion is located on the second plate. The second plate is parallel to the first plate in arrangement. The conductive portion corresponds to the second sensitive portion in a way that an interval is located therebetween. A second conductive wire is located on the second plate and electrically connected with the conductive portion. A grounded circuit is located between the first and second plates and spaced from the second sensitive portion. The grounded circuit partially overlaps or crosses the first or second conductive wire.

14 Claims, 10 Drawing Sheets

CIRCUIT SWITCH FOR KEYBOARD

BACKGROUND OF THE INVENTION

1. Field of the Invention

The present invention relates generally to a keyboard and more particularly, to a circuit switch for a keyboard.

2. Description of the Related Art

To prevent multiple keys of a keyboard from misjudgment while they are pushed to work at the same time, a capacitive circuit board is usually used to serve as the detecting circuit of the keys. For example, U.S. Pat. No. 3,921,167 disclosed a capacitive circuit board, which includes two boards having respective printed circuits and an insulated layer mounted between the two boards. Capacitance can be generated between the printed circuits of the two boards and when the two printed circuits are electrically connected, the electric state of the circuit board can be detected.

Taiwan Pat. No. M377824 disclosed a keyboard membrane circuit board, which includes corresponsive electrodes located at the first and third membranes. Each of the electrodes is connected with a capacitive electrode in series. A second membrane is mounted between the first and third membranes and includes a plurality of through holes. Each of the through holes is located at a position corresponding to one of the electrodes, so the electrodes can contact one another via the through holes for conduction while the second membrane can isolate the first and third membranes from each other.

However, in the process of manufacture of the aforesaid second membrane, burrs or irregular surfaces are subject to formation around the through holes to make the first and third thin membranes fail to keep consistent interval therebetween or make the interval of some area therebetween smaller or larger to further make the capacitance generated between the first and third membranes fail to remain stable and to be accurately applied to detection of actions of the keys. Besides, electrodes and circuits need to be disposed on the first and third membranes, so it is not easy to add or adjust the layouts of other sensitive circuits or grounded circuits. In this way, the circuit design becomes more complicated and the size of the whole circuit hardware cannot be effectively reduced.

SUMMARY OF THE INVENTION

The primary objective of the present invention is to provide a circuit switch, content and layout of which are flexibly adjustable as per actual needs to lower the complexity of the circuit design and which can accurately and stably detect actions of keys of a keyboard.

The foregoing objective of the present invention is attained by the circuit switch formed of a first plate and a second plate. A first sensitive portion and a second sensitive portion are mounted on a surface of the first plate and superposed on each other. A first insulated portion is mounted between the first and second sensitive portions to electrically insulate them against each other. A first conductive wire is located on the first plate and electrically connected with the first sensitive portion. A conductive portion is formed on a surface of the second plate. The second plate is parallel to the first plate in arrangement. The conductive portion corresponds to the second sensitive portion in such a way that an interval is located between the conductive portion and the second sensitive portion. A second conductive wire is located on the second plate and electrically connected with the conductive portion. A grounded circuit is located between the first and second plates and spaced from the second sensitive portion. The grounded circuit partially overlaps or crosses the first or second conductive wire.

In light of the structure mentioned above, the first and second sensitive portions can keep a fixed interval therebetween from each other, so the capacitive effect generated can be stable to accurately and stably detect the actions of the keys. Besides, mounting the grounded circuit to different positions can make the content and layout of the circuit adjustable as per actual needs, further lowering the complexity of the circuit design.

DETAILED DESCRIPTION OF PREFERRED EMBODIMENTS

Structural features and desired effects of the present invention will become more fully understood by reference to four preferred embodiments given hereunder. However, it is to be understood that these embodiments are given by way of illustration only, thus are not limitative of the claim scope of the present invention.

Figure 1:
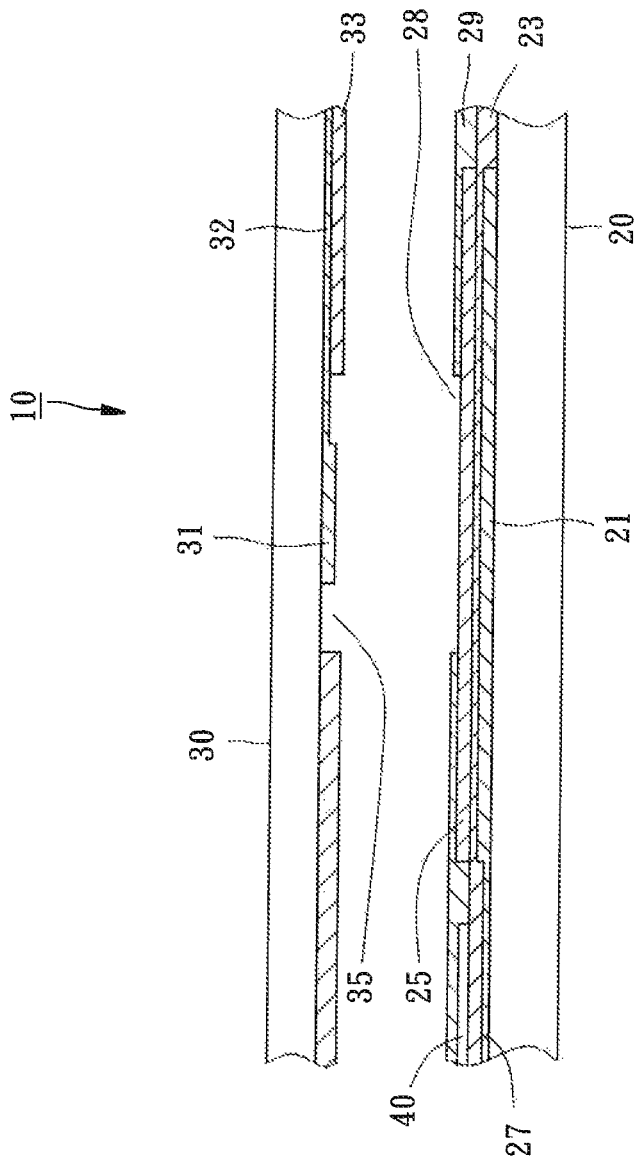
FIG. 1 is a partially sectional exploded view of a first preferred embodiment of the present invention.
Figure 2:
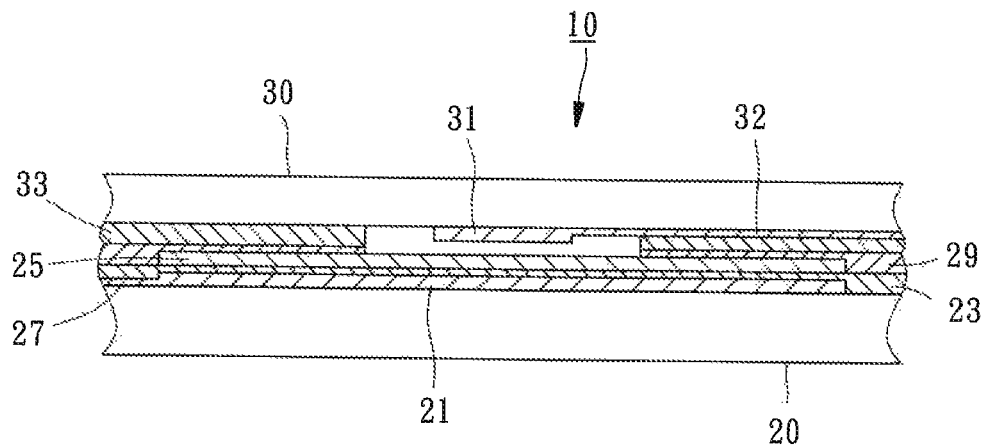
FIG. 2 is a partially sectional view of the first preferred embodiment of the present invention.

Referring to FIGS. 1-2, a circuit switch 10 for keys of a keyboard in accordance with a first preferred embodiment of the present invention is formed of a first plate 20 and a second plate 30. Each of the first and second plates 20 and 30 is made of a flexible membrane, such as Mylar®, which can be externally forced to bend. The detailed descriptions and operations of these elements as well as their interrelations are recited in the respective paragraphs as follows.

A conductive laminated first sensitive portion 21, a laminated first insulated portion 23, and a conductive laminated second sensitive portion 25 are mounted to a top side of the first plate 20 in order by means of printed coating or electroplating. The first insulated portion 23 is held between the first sensitive portion 21 and the second sensitive portion 25 to electrically insulate them against each other. The first sensitive portion 21 is laterally electrically connected with a first conductive wire 27 which is adapted for connection with a signal wire or a scan line. A grounded circuit 40 is disposed on a top side of the first insulated portion 23 and spaced from the second sensitive portion 25 in a predetermined interval. A second insulated portion 29 is disposed on top sides of the second sensitive portion 25 and the grounded circuit 40 and includes a hollow portion 28 formed at a midsection thereof to expose a corresponsive midsection of the second sensitive portion 25 from the hollow portion 28.

Figure 17:
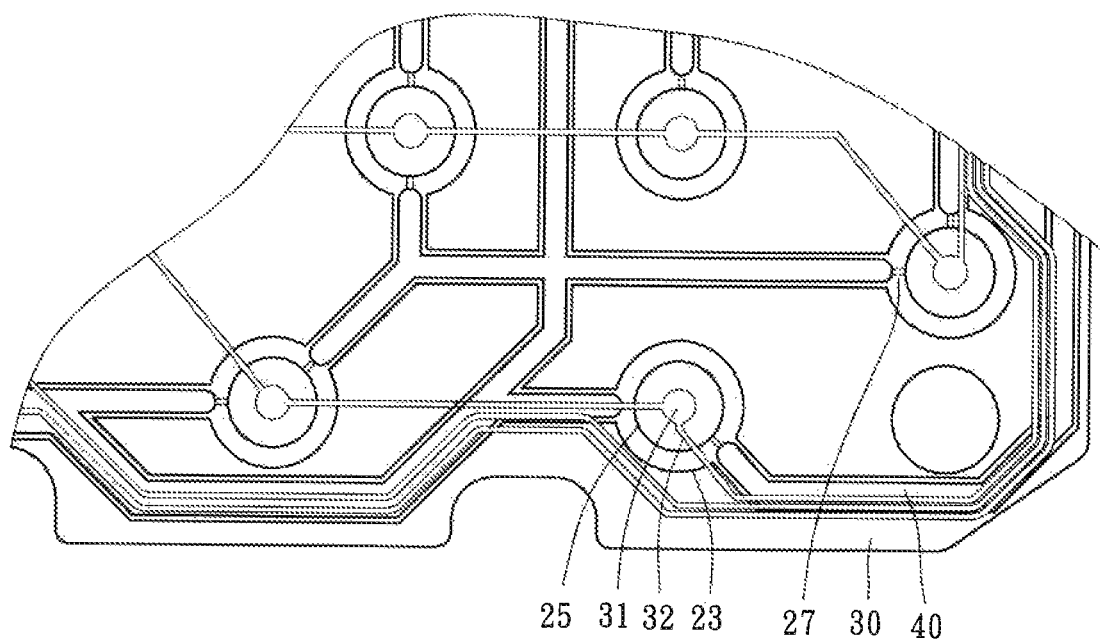
FIG. 17 is a partially elevation view of the present invention.

A conductive portion 31 is disposed on a bottom side of the second plate 30 and laterally electrically connected with a second conductive wire 32. The first and second conductive wires 27,32 are electrically connected with a signal processor (not shown). A third insulated portion 33 is disposed on the bottom side of the second plate 30 and similarly includes a hollow portion 35. The conductive portion 31 is located at the hollow portion 35 to be exposed at the bottom side of the second plate 30. The grounded circuit 30 is located between the first and second plates 20,30, and as shown in FIG. 17, the grounded circuit 40 partially overlaps or crosses the first and second conductive wires 27,32.

Referring to FIG. 2 again, the first and second plates 20,30 are superposed on each other in such a way that they are spaced from each other in parallel. The bottom side of the second plate 30 corresponds to the top side of the first plate 20. The second and third insulated portions 29, 33 contact against each other. The conductive portion 31 is located inside the two hollow portions 28,35 and mounted over the second sensitive portion 25 in a predetermined interval.

Figure 3:
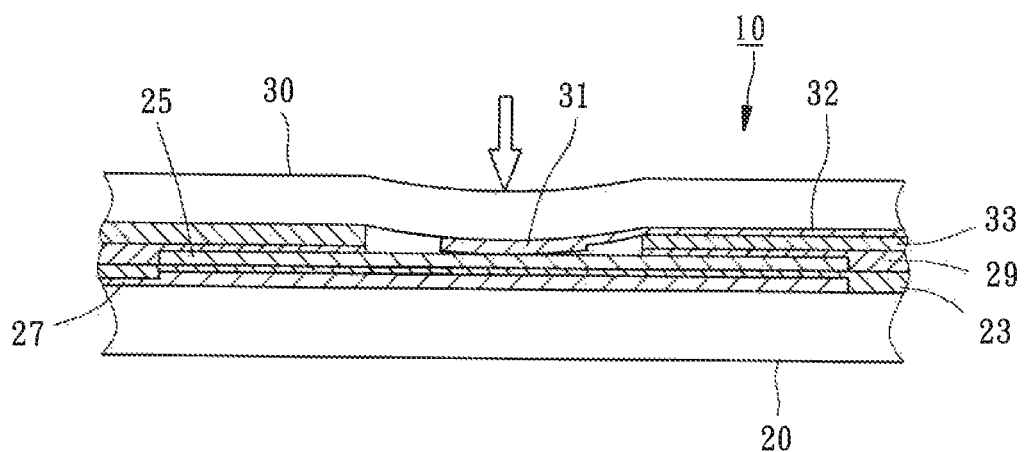
FIG. 3 is a partially sectional view of the first preferred embodiment of the present invention in operation.

Referring FIG. 3, when the present invention is applied to a key (not shown), the first and second plates 20,30 are mounted below the key and while a user's finger pushes the key, the key contacts against the top side of the second plate 30 where the top side corresponds to the conductive portion 31 and then the second plate 30 is partially forced for deformation to further make the conductive portion 31 electrically conduct the second sensitive portion 25. When the conductive portion 31 and the second sensitive portion 25 are mutually electrically conducted, the capacitance can be electrically conducted by the conductive portion 31 to be transmitted to the second conductive wire 32. In this way, it can be determined that the corresponsive key has acted.

The first insulated portion 23 is disposed between the second sensitive portion 25 and the first sensitive portion 21 to make the first and second sensitive portions 21,25 keep a constant interval, so overgreat deviation will not happen in the process of production to make the capacitive effect between the first and second sensitive portions 21,25 relatively stable. Besides, the sensitive area between the first and second sensitive portions 21,25 are larger, so the capacitance becomes relatively greater.

In light of the above, the actions of the keys can be detected more accurately and stably relatively.

Figure 4:
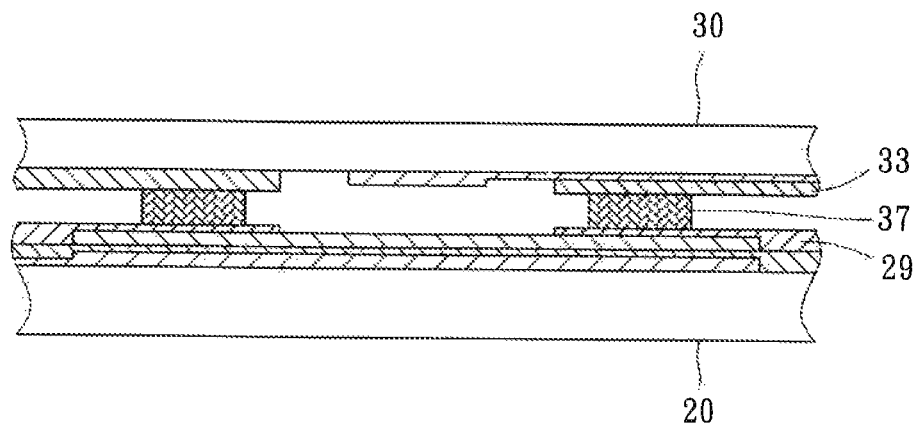
FIG. 4 is another partially sectional view of the first preferred embodiment of the present invention.
Figure 5:
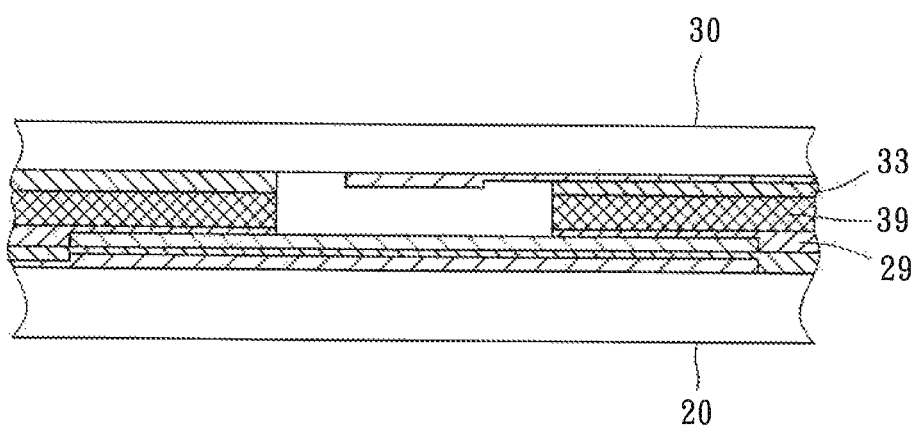
FIG. 5 is a partially sectional view of an alternative structure in accordance with the first preferred embodiment of the present invention.

Referring to FIGS. 4-5, an insulated ring 37 or a partition layer 39 can alternatively be mounted between the first and second plates 20,30 for increasing the distance between the conductive portion 31 and the second sensitive portion 25. Besides, the second and third insulated portions can be replaced by two partition layers to reach the same purpose.

Figure 6:
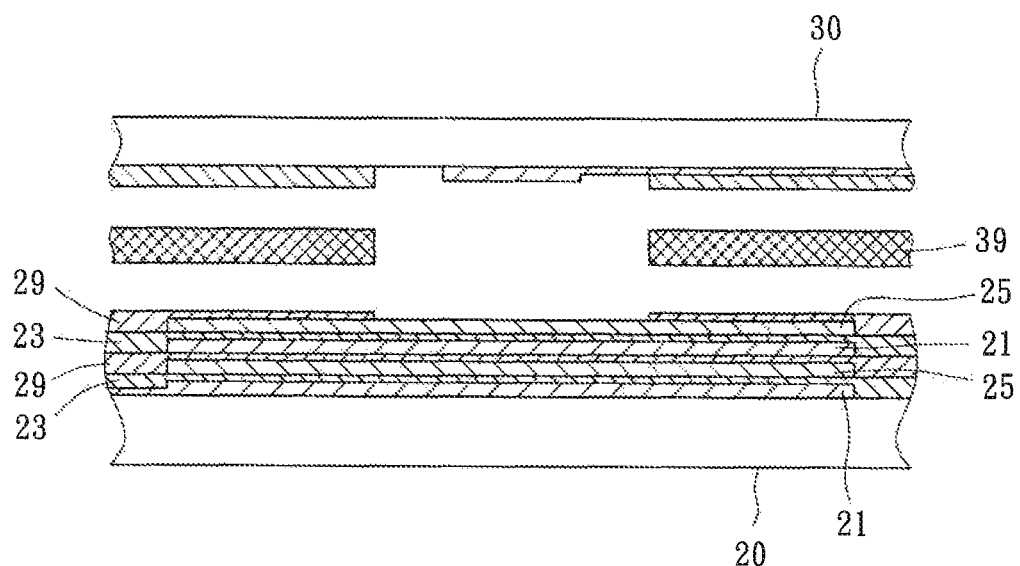
FIG. 6 is a partially sectional exploded view of another alternative structure in accordance with the first preferred embodiment of the present invention.
Figure 7:
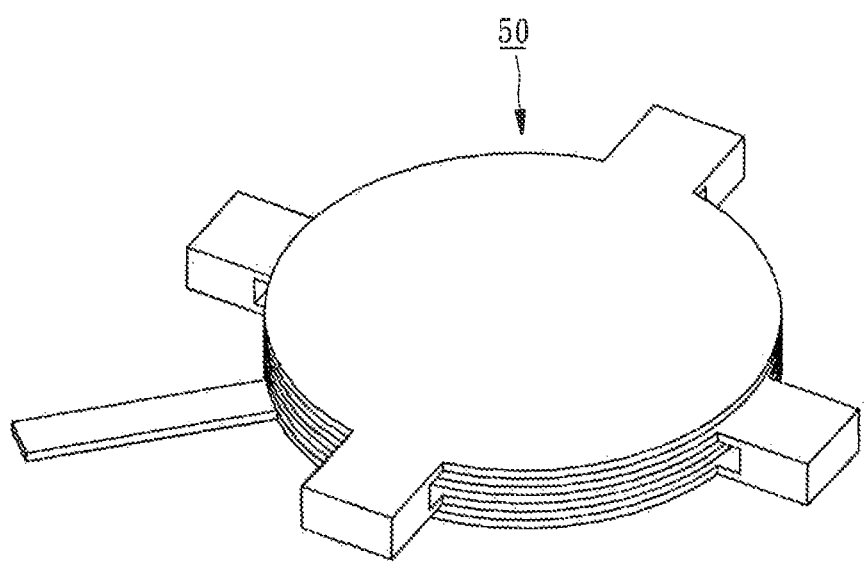
FIG. 7 is a perspective view of the alternative structure shown in FIG. 6.

Referring FIGS. 6-7, one or more sets of the first sensitive portion 21, the first insulated portion 25, the second sensitive portion 25, and the second insulated portion 29 can be superposed on the top side of the first plate 20 for increasing the electric capacity of the circuit switch of the present invention to further enhance the detective effect of the actions of the keys.

Figure 8:
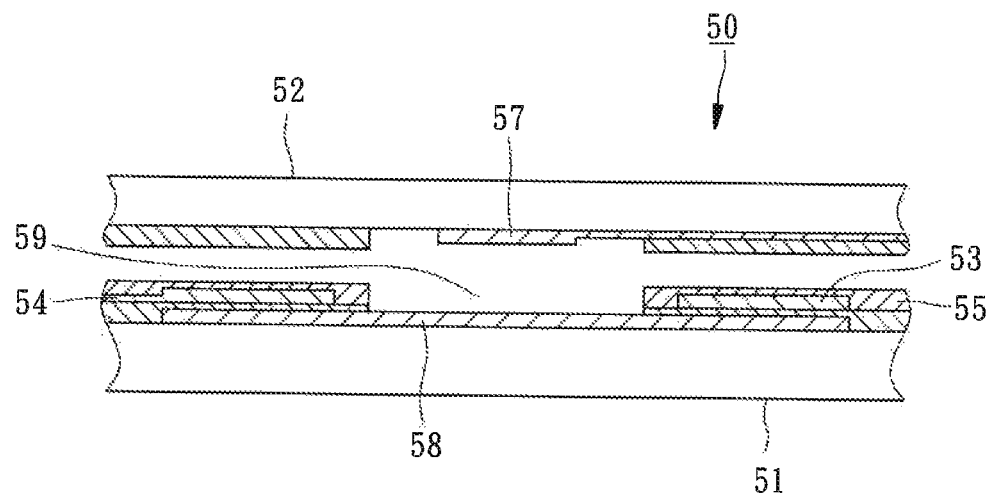
FIG. 8 is a partially sectional exploded view of a second preferred embodiment of the present invention.
Figure 9:
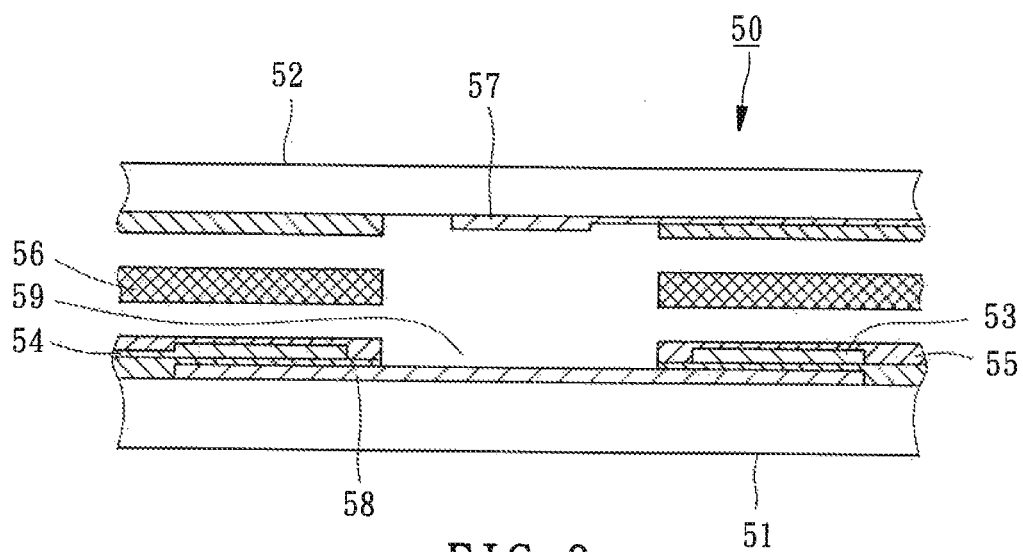
FIG. 9 is a partially sectional exploded view of an alternative structure in accordance with the second preferred embodiment of the present invention.
Figure 10:
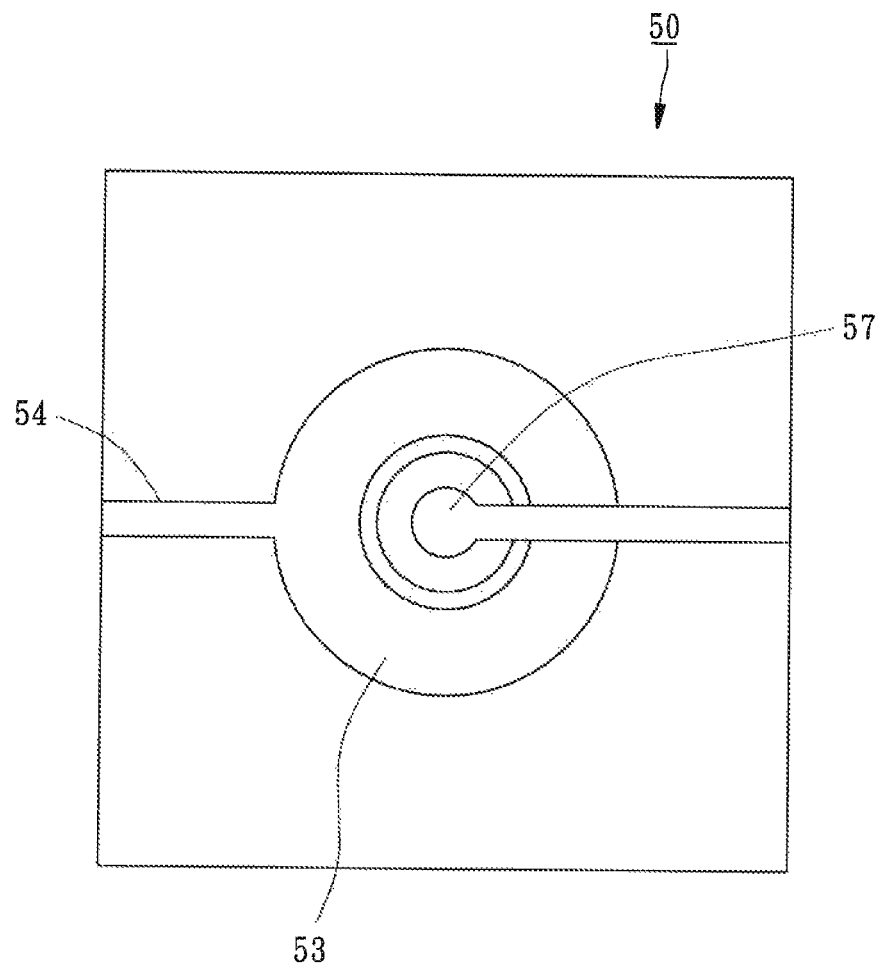
FIG. 10 is a top view of the second embodiment of the present invention.

Referring to FIGS. 8-10, a circuit switch 50 constructed according to a second preferred embodiment of the present invention is structurally similar o that of the first preferred embodiment of the present invention, having the following differences. The second sensitive portion 53 located on the top side of the first plate 51 is annular and includes a hollow portion 59. The first conductive wire 54 is electrically connected with the second sensitive portion 53. The second insulated portion 55 is covered on the second sensitive portion 53 and the first conductive wire 54 to expose a part of the first sensitive portion 58 through the hollow portion 59. Referring to FIG. 9, in the circuit switch of the second preferred embodiment, a partition layer 56 can be alternatively mounted between the first and second plates 51,52. In this way, when the second plate 52 is oppressed to make the conductive portion 57 stopped against the first sensitive portion 58. The capacitive effect generated between the first and sensitive portions 58,53 can he conducted via the conductive wire 54 to reach the purpose of the present invention.

Figure 11:
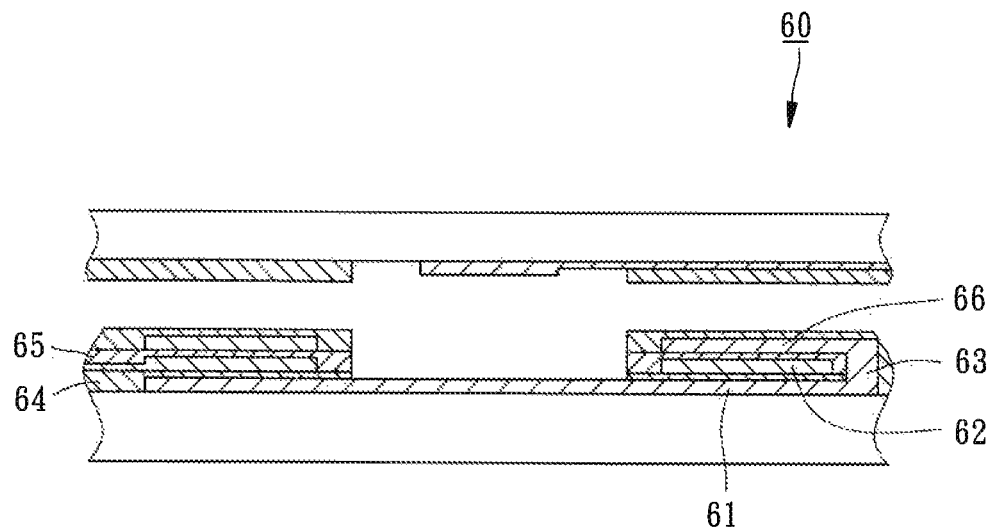
FIG. 11 is a partially sectional exploded view of a third preferred embodiment of the present invention.
Figure 12:
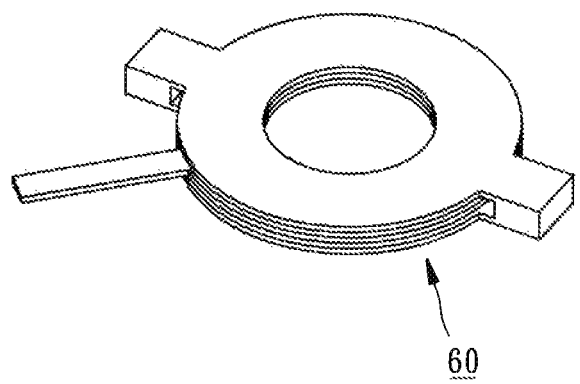
FIG. 12 is a perspective view of the third preferred embodiment of the present invention.
Figure 13:
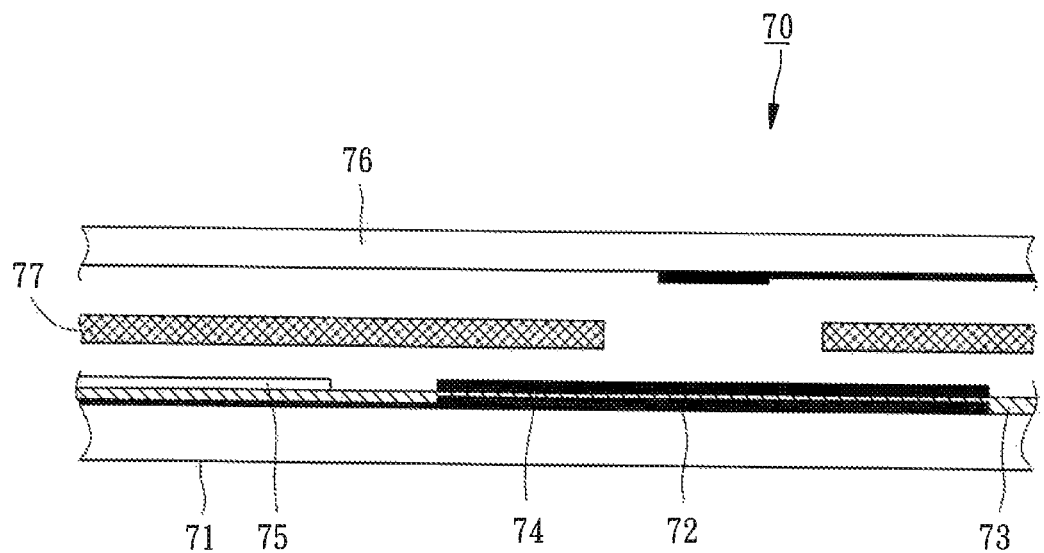
FIGS. 13-16 are partially sectional exploded views of a fourth embodiment of the present invention, illustrating that the grounded circuit is located at different positions.

Referring to FIGS. 11-12, a circuit switch 60 constructed according to a third preferred embodiment of the present invention is structurally similar to that of the second preferred embodiment, having the following differences. An electrically conductive coupling portion 63 is formed at the same sides of the first and second insulated portions 64,65 and electrically connected with the first sensitive portion 61 and a third sensitive portion 66 superposed on a top side of the second insulated portion 65, running through the first and second insulated portions 64,65. In this way, the first sensitive portion 61 is conducted with the third sensitive portion 66 to increase the capacitive sensitive area to further increase the electric capacity.

Figure 14:
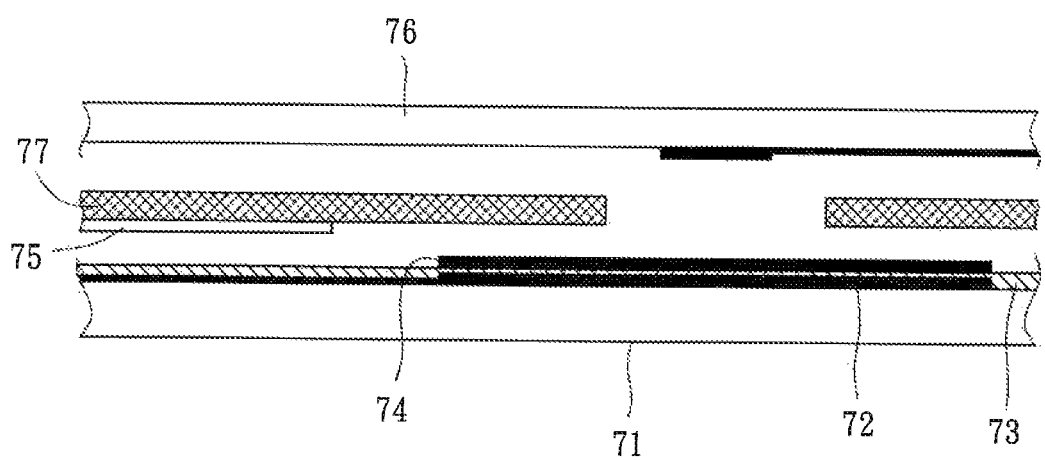
Figure 15:
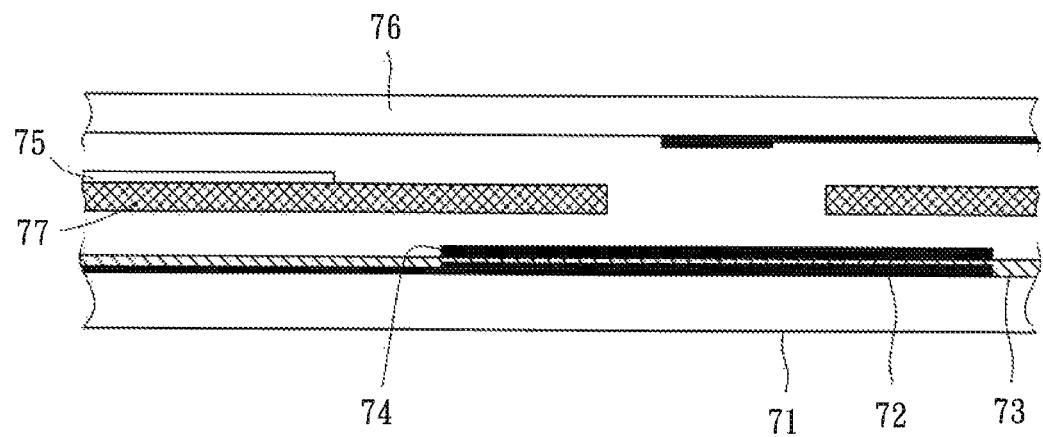
Figure 16:
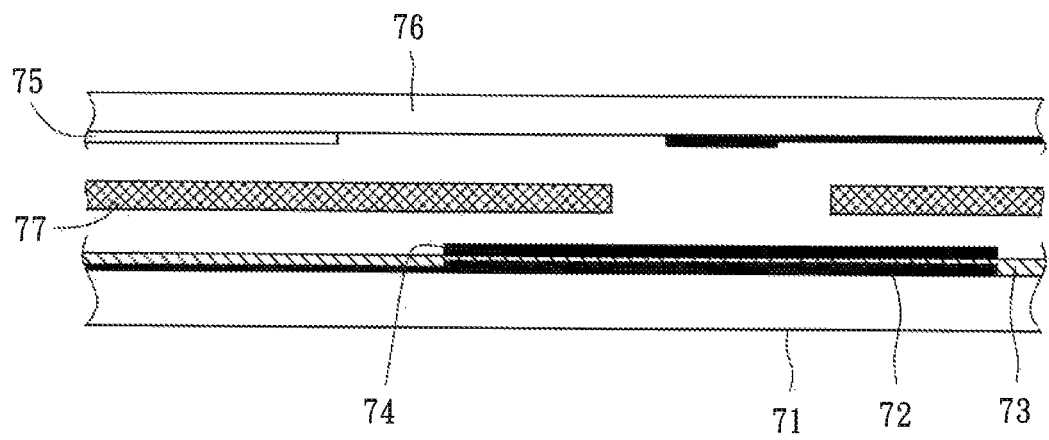

Referring to FIGS. 13-16, a circuit switch 70 constructed according to a fourth preferred embodiment of the present invention, having the following characteristics recited below. The first sensitive portion 72, the first insulated portion 73, and the second sensitive portion 74 are mounted to the first plate 71 in order. The grounded circuit 75 is mounted to the surface of the first insulated portion 73. The first and second plates 71,76 can be separated from each other by a partition layer 77 to achieve the purpose of the present invention. The grounded circuit 75 can be mounted to the top or bottom side of the partition layer 77 as per the actual need for layout, as shown in FIGS. 14-15, or mounted straight to the bottom side of the second plate 76, as shown in FIG. 16. Aforesaid various arrangements can flexibly adjust circuit content and layout as per actual needs to lower the complexity of the circuit design.

It is worth mentioning that a meshed conductive layer can be mounted to each of the top sides of the first plate and the bottom side of the second plate or to the top or bottom side of the partition layer for grounding.

What is claimed is:

1. A circuit switch for keys of a keyboard, comprising:
a first plate, on a surface of which a first sensitive portion and a second sensitive portion are mounted and superposed on each other, a first insulated portion being mounted between the first and second sensitive portions for electrically insulating the first and second sensitive portions against each other, a first conductive wire being located at the first plate and electrically connected with the first sensitive portion;
a second plate, on a surface of which a conductive portion is mounted, the first and second plates being arranged in parallel, the conductive portion corresponding to the second sensitive portion in a way that they are spaced from each other, a second conductive wire being located at the second plate and electrically connected with the conductive portion;

a grounded circuit mounted between the first and second plates and spaced from the second sensitive portion, the grounded circuit partially overlapping or crossing the first or second conductive wire; and a second insulated portion mounted to a top side of the second sensitive portion, the second insulated portion having a hollow portion for exposing a part of the second sensitive portion.

2. The circuit switch as defined in claim 1, wherein the grounded circuit is superposed on a surface of the first insulated portion.

3. The circuit switch as defined in claim 1, wherein the grounded circuit is mounted to a surface of the first plate.

4. The circuit switch as defined in claim 1, wherein a partition layer is mounted between the first and second plates and the grounded circuit is mounted to a surface of the partition layer where the surface of the partition layer faces the second plate.

5. The circuit switch as defined in claim 4, wherein a meshed conductive layer is mounted to a surface of the partition layer.

6. The circuit switch as defined in claim 1, wherein a partition layer is mounted between the first and second plates and the grounded circuit is mounted to a surface of the partition layer where the surface of the partition layer faces the first plate.

7. The circuit switch as defined in claim 1, wherein a meshed conductive layer is mounted on the surface of the first plate.

8. The circuit switch as defined in claim 1 further comprising an electrically conductive coupling portion, wherein the coupling portion runs through the first and second insulated portion and electrically connected with the first sensitive portion and a third sensitive portion superposed on the second insulated portion.

9. The circuit switch as defined in claim 1, wherein a partition layer is mounted between the first and second plates.

10. The circuit switch as defined in claim 1, wherein a third insulated portion is mounted to the second plate, the third insulated portion having a hollow portion, the conductive portion being located at the hollow portion.

11. The circuit switch as defined in claim 1, wherein a meshed conductive layer is mounted to the surface of the second plate.

12. The circuit switch as defined in claim 1, wherein the second sensitive portion comprises a hollow portion; the conductive portion corresponds to the hollow portion of the second sensitive portion; the first sensitive portion being partially exposed through the hollow portion.

13. The circuit switch as defined in claim 1 further comprising a second insulated portion covered on the second sensitive portion.

14. The circuit switch as defined in claim 1, wherein at least one said first sensitive portion and at least one said second sensitive portion are mounted to the first plate, the at least one said first and second sensitive portions being superposed on the first plate electrically insulatedly and alternately.

* * * * *